United States Patent [19]

Graven et al.

[11] 4,118,249
[45] Oct. 3, 1978

[54] MODULAR ASSEMBLY OF A PHOTOVOLTAIC SOLAR ENERGY RECEIVER

[75] Inventors: Robert M. Graven, Downers Grove; Anthony J. Gorski, Lemont; William W. Schertz, Batavia; Johan E. A. Graae, Elmhurst, all of Ill.

[73] Assignee: The United States of America as represented by the United States Department of Energy, Washington, D.C.

[21] Appl. No.: 829,122

[22] Filed: Aug. 30, 1977

[51] Int. Cl.² ........................................... H01L 31/04
[52] U.S. Cl. ............................................. 136/89 PC
[58] Field of Search ................... 136/89 PC; 357/81

[56] References Cited

U.S. PATENT DOCUMENTS

| | | | |
|---|---|---|---|
| 3,972,012 | 7/1976 | Liu | 333/84 M |
| 3,999,283 | 12/1976 | Dean et al. | 29/572 |
| 4,008,487 | 2/1977 | Vogt | 357/81 |
| 4,029,519 | 6/1977 | Schertz et al. | 136/89 PC |
| 4,056,405 | 11/1977 | Varadi | 136/89 PC |

Primary Examiner—John H. Mack
Assistant Examiner—Aaron Weisstuch
Attorney, Agent, or Firm—Dean E. Carlson; Frank H. Jackson; Paul A. Gottlieb

[57] ABSTRACT

There is provided a modular assembly of a solar energy concentrator having a photovoltaic energy receiver with passive cooling. Solar cell means are fixedly coupled to a radiant energy concentrator. Tension means bias a large area heat sink against the cell thereby allowing the cell to expand or contract with respect to the heat sink due to differential heat expansion.

8 Claims, 2 Drawing Figures

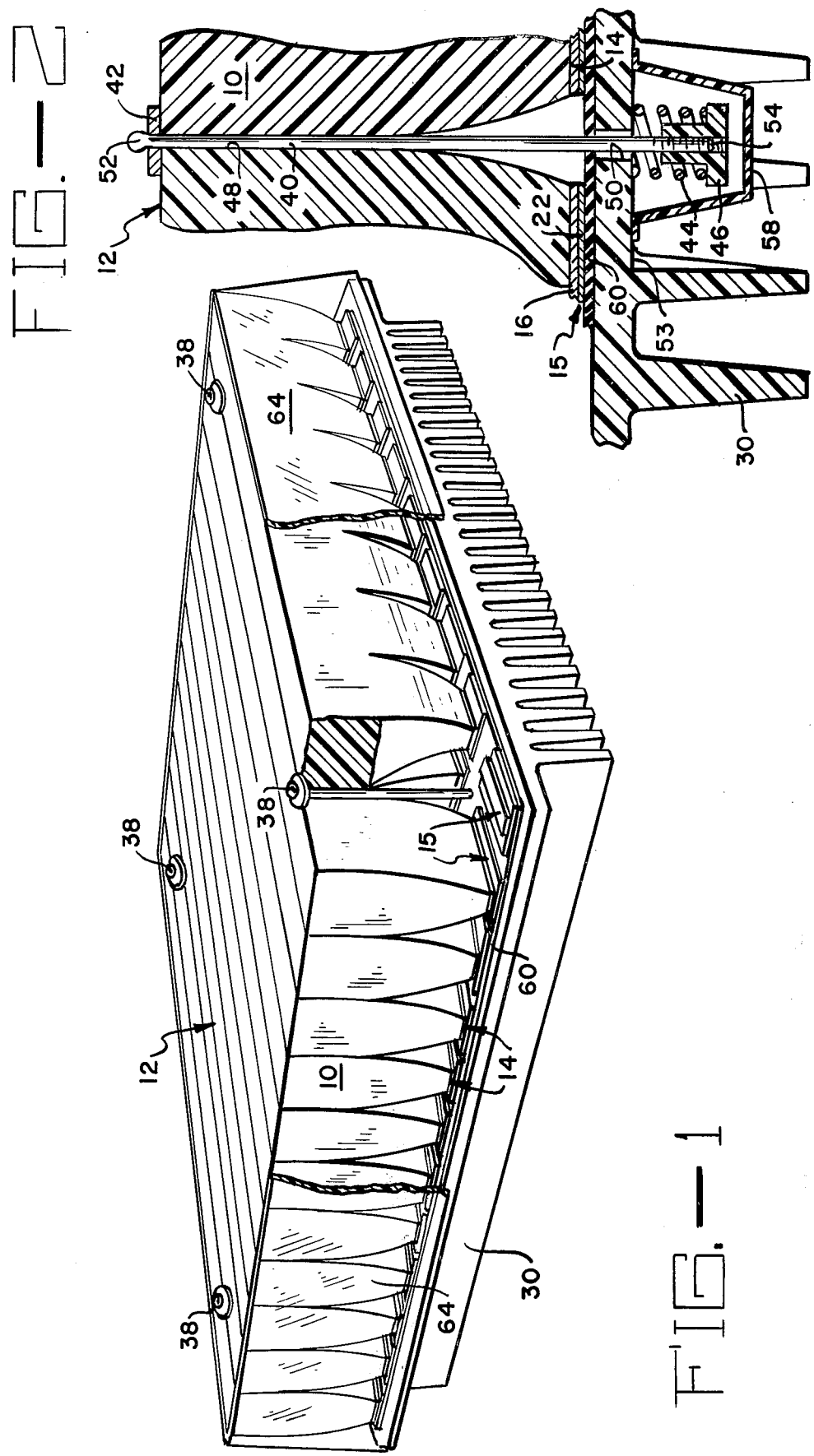

`4,118,249`

MODULAR ASSEMBLY OF A PHOTOVOLTAIC SOLAR ENERGY RECEIVER

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

Solar energy collection devices utilizing photovoltaic means for direct conversion of incident radiation into electrical energy are currently undergoing extensive development to reduce their cost. Use of radiant energy concentration devices, such as described in U.S. Pat. No. 4,029,519 in combination with solar cells, is one promising area because of the reduction in total cell area obtained. Particular problems associated with such a combination are cooling of the cells, and concentrator durability. In the patent previously referred to there is shown a combination of such elements including a solid plastic concentrator element that would be suitable for active cooling due to the open nature of the bottom of the assembly. Where a completely passive cooling system is desired, one must design for the maximum heat needed to be dissipated from each cell to prevent damage to the cells and concentrators. Of course, a hollow plastic concentrator element such as described in U.S. patent application Ser. No. 811,347 or any other type of concentrator element may also be utilized.

It is therefore an object of this invention to provide an improved solar energy concentration device utilizing photovoltaic cells for the direct conversion of incident energy into electrical energy.

Another object of this invention is to provide an improved solar energy receiver having photovoltaic means and requiring passive cooling.

SUMMARY OF THE INVENTION

A modular assembly of a photovoltaic solar energy receiver is provided. It includes an energy concentrator element having an exit surface to which solar cells are fixed. An extended heat sink is biased against the photovoltaic cells by spring means to allow for heat to be transferred from the photovoltaic elements to the sink while allowing for differential heat expansion between the cells and concentrator and the heat sink. The force exerted by the spring means holds the assembly together and the extended nature of the heat sink effectively seals a large portion of the concentrator element and cells from the outside environment. That which is not sealed by the sink may be sealed off by suitable lightweight plastic.

BRIEF DESCRIPTION OF THE DRAWINGS

FIG. 1 shows a view of modular assembly of photovoltaic solar energy receiver, and FIG. 2 is a section showing one portion of the assembly.

DETAILED DESCRIPTION OF THE PREFERRED EMBODIMENT

Referring to FIG. 1 and FIG. 2 there is shown a modular assembly of a solar energy collection device. The assembly includes a concentrator element 10 upon whose entrance surface 12 solar energy is intended to be incident. The energy incident on surface 12 is concentrated onto exit surfaces 14 at the bottom of concentrator element 10. The total area of faces 14 is smaller than the area of surface 12. In FIG. 1 concentrator element 10 is shown as a solid element such as described in the U.S. Pat. No. 4,029,519 referred to above which utilizes total internal reflection to direct radiant energy. Concentrator element 10 could be any type of device including a "hollow" element such as described in Ser. No. 811,347 application or any other type of radiant energy concentrator whether made of plastic, metal or any other material. The disclosed assembly is of a solar collection device utilizing photovoltaic means for the direct conversion of solar energy into electrical energy. Therefore, there is positioned coincident with each exit surface 14, a solar cell package 15. Solar cells require cooling to ensure their lifetime and to operate at miximum efficiency. Each package 15 therefore includes a solar cell 16 and a small heat sink 22 to which the cell is soldered. The cell 16 is in thermal and electrical contact with the sink 22. Wires (not shown) are coupled to each cell to obtain the electrical output. For a passively cooled solar receiver having high concentration due to concentrator element 10, a small heat dissipation surface such as small heat sink 22 does not provide adequate heat removal at higher temperatures to assure extended cell and concentrator element life. Therefore, it is necessary to thermally couple each cell to a larger heat dissipation surface, such as an extended heat sink 30 which provides a large heat dissipation surface.

It is not desirable to simply mount each package 15 on the sink 30 because each cell 16 needs to be electrically insulated from each other cell 16. Further, because of the geometry involved, the temperature gradients within the heat sinks and the differences in the nature of the thermal expansion rates of the materials of element 10, cell 16, sink 22 and sink 30, fixed bonding of sink 30 to sink 22 is impractical. There is therefore provided a unique assembly whereby a thermal contact is maintained without electrical contact between sink 30 and sink 22 allowing for differential heat expansion between these elements. Because of its large surface area and especially if it is of plastic, element 10 will have the highest coefficient of expansion. Package 15 needs to be bonded to each surface 14 to maintain proper alignment of each cell 16 with respect to each surface 14. The motion of element 10 will therefore carry package 15 with it. Also bonding of package 15 to surface 14 insures high light transmission between element 10 and cell 16. A clear room temperature vulcanizing adhesive provides a satisfactory bond between cell 16 and surface 14.

The assembly of elements is coupled together with a biasing means 38 which includes a rod 40, washer 42, spring 44, and end cap 46. In the embodiment shown, there are four biasing means 38 positioned approximately at the corners of the array. As more particularly shown in FIG. 2, holes 48 extend through the concentrating element 10 and holes 50 extend through sink 30 aligned with the holes 48. The heat sink 30 is machined about hole 48 to allow for recess 53 to receive means 38. Into each combination of holes 48 and 50 is positioned a rod 40 with a knob 52 at one end thereof retained by washer 42. The other end 54 of each rod is threaded and coupled thereto is cap 46 which depending upon its position on end 54 determines the pressure on spring 44. Spring 44 exerts force between the flange of cap 46 and the flattened machine portion 53 of sink 30. The effect of the biasing means 38 is to tend to press each small sink 22 against the larger heat sink 30 to obtain a thermal coupling without a fixed coupling between the two elements. This allows for differential heat expansion between sinks 22 and 30 since sink 22 can slide about on sink 30. It is necessary to electrically insulate surface 22 from sink 30 so a material 60 is placed between them. The material 60 must both be an electrical insulator and a heat conductor. An example of an acceptable material is thin Mylar film. The film should be as thin as possible to eliminate air gaps and to allow for adequate heat transfer between the sinks. For ease of assembly, a sheet of material may be glued to sink 30 with an epoxy glue. The top surface of material 60 may be coated with a thin layer of heat conducting grease to provide a good thermal contact. The rods 40 and washers 42 may be of stainless steel or of a clear material so that they do not shade the cells 16. With the coupling of cell package 15 to sink 30, it may be that sink 22 is not necessary although shown in the disclosed embodiment.

It is desirable to seal the assembly to prevent degradation of the concentrator element 10 and the cell 16 by the environmental elements. The disclosed assembly has the advantage that the heat sink 30 also serves to seal the bottom of the assembly, leaving only the sides exposed. To seal holes 50 plastic caps 58 are glued over each hole. To seal the sides a sheet 64 of thin clear plastic such as Aclar may be glued around the sides to fully seal the assembly. An epoxy glue would be satisfactory. Sheet 64 needs to be pliable to allow for the differential heat expansion between element 10 and sink 30.

The primary failure mode of terrestrial solar photovoltaic panels is oxidation of the solar cell electrical contacts. To date, this problem has not been solved although possible solutions, such as gold contact cells, are being pursued. If such a solution is found, then sheet 64 needs only be necessary to keep out dust, water, bugs, etc. If no solution to contact corrosion is available, then sheet 64 might be of a material which would allow the space about cells 16 to be filled with an inert gas such as dry nitrogen to protect cells 16.

The embodiments of the invention in which an exclusive property or privilege is claimed are defined as follows:

1. A modular assembly of a photovoltaic solar energy receiver, comprising:
a concentrator element, a solar cell package which when subjected to large temperature differences over time will expand and contract, a first heat sink having a surface larger than said solar cell package positioned with said solar cell package between and in contact with both said concentrator element and said heat sink, and biasing means for exerting force holding said surface of said first heat sink against said cell package thereby allowing for differential heat expansion between said solar cell package, said concentrator element and said heat sink.

2. The device of claim 1 further including a sheet of heat conductive electrically insulative material positioned between said heat sink and said solar cell package.

3. The device of claim 2 wherein said concentrator element is of plastic.

4. The device of claim 3 wherein said concentrator element concentrates incident radiant energy onto a plurality of exit surfaces, there being a solar cell package coupled in a fixed manner to each exit surface.

5. The device of claim 4 wherein each solar cell package includes a second, smaller area heat sink and a solar cell, said solar cell being bonded to and positioned between said second heat sink and said exit surface, said small sink being biased by said biasing means against said sheet.

6. The device of claim 5 wherein said first heat sink seals the bottom of said assembly and further including side panels coupled to said concentrator element and said first heat sink for sealing the sides of said assembly.

7. The device of claim 6 wherein said concentrator element is of solid plastic whereby radiant energy to be concentrated must pass through the solid plastic of said element.

8. The device of claim 7 wherein said biasing means includes a rod, a washer coupled to one end of said rod for exerting force on one side of said assembly, a spring, and a threaded cap threaded to the other end of said rod for exerting force on said spring positioned between said cap and the other side of said assembly.

* * * * *